United States Patent
Wang et al.

(10) Patent No.: US 7,733,654 B2
(45) Date of Patent: Jun. 8, 2010

(54) HEAT DISSIPATION MODULE

(75) Inventors: Cheng Wang, Hsinchu (TW); Shang-Hsuang Wu, Hsinchu (TW)

(73) Assignee: Coretronic Corporation, Hsin-Chu (TW)

( * ) Notice: Subject to any disclaimer, the term of this patent is extended or adjusted under 35 U.S.C. 154(b) by 116 days.

(21) Appl. No.: 12/230,479

(22) Filed: Aug. 29, 2008

(65) Prior Publication Data

US 2009/0147454 A1    Jun. 11, 2009

(30) Foreign Application Priority Data

Dec. 7, 2007    (TW) .............................. 96146661 A

(51) Int. Cl.
*H05K 7/20* (2006.01)

(52) U.S. Cl. ..................... 361/710; 361/703; 361/790; 165/104.26; 165/272; 165/180; 257/712; 62/260

(58) Field of Classification Search ................ 361/690, 361/699, 700, 703, 710, 719, 790
See application file for complete search history.

(56) References Cited

U.S. PATENT DOCUMENTS

2003/0056943 A1    3/2003 Dessiatoun et al.

*Primary Examiner*—Jayprakash N Gandhi
*Assistant Examiner*—Courtney Smith
(74) *Attorney, Agent, or Firm*—Bacon & Thomas, PLLC

(57) ABSTRACT

A heat dissipation module is used to cool a microprocessor. The heat dissipation module includes a base, a diversion pipeline, a plurality of heat conductive pieces and a fan. The base is assembled on the microprocessor. The diversion pipeline is connected to the base, provides a diversion direction, and has a heat insulated pipe-wall which partitions the diversion pipeline into an inside and an outside portions and reduces the heat conduction in the diversion direction of the diversion pipeline. The heat conductive pieces are fixed on the diversion pipeline, and have a heat dissipation direction from the inside portion to the outside portion of the diversion pipeline which crosses the diversion direction. Each two neighboring heat conductive pieces are separated with the heat insulated pipe-wall. The fan is assembled on the outside of the diversion pipeline and provides a cool air for the heat conductive pieces.

23 Claims, 9 Drawing Sheets

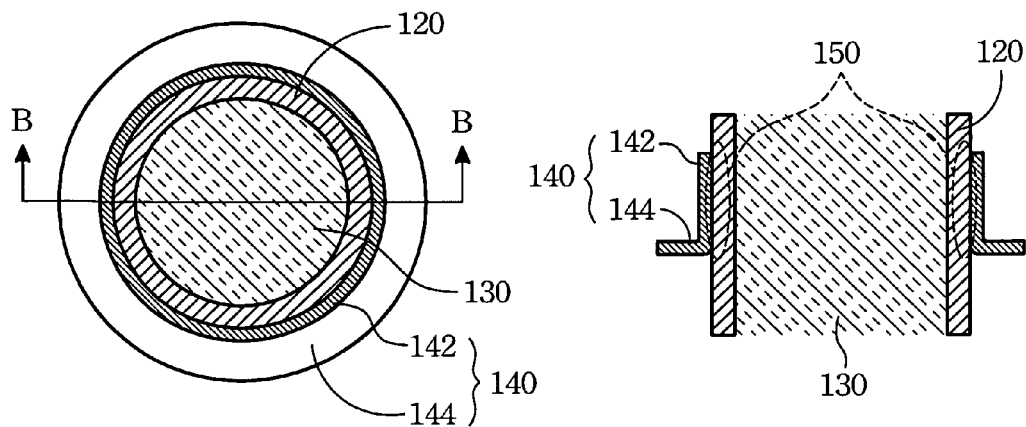
FIG. 1B (Prior Art)
FIG. 1C (Prior Art)
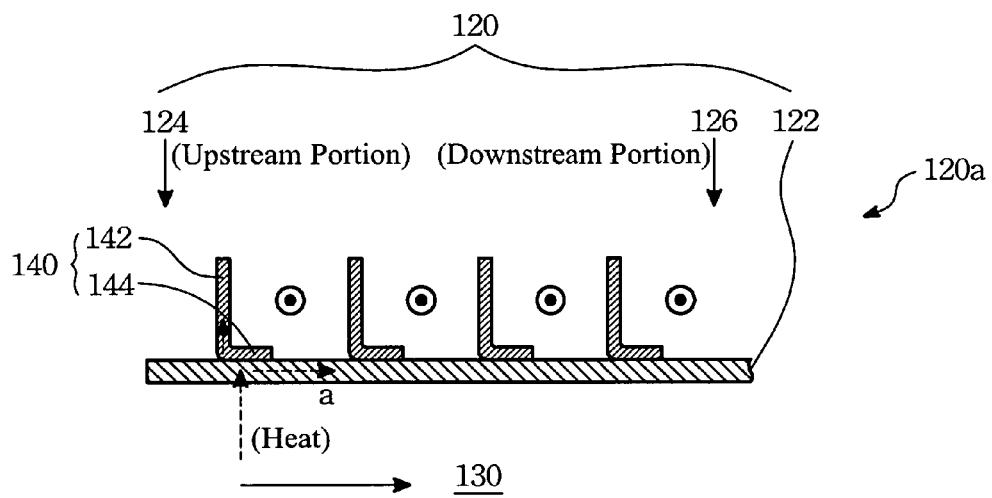
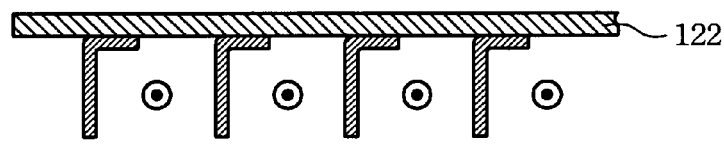
FIG. 1D (Prior Art)

HEAT DISSIPATION MODULE

BACKGROUND OF THE INVENTION (1) Field of the Invention

The invention relates to a heat dissipation module, and more particularly relates to a heat dissipation module applied to cooling a microprocessor.

(2) Description of the Prior Art

With the development of the CPU speed and reduction of the CPU size in market, the traditional heat dissipation technology 'radiator fin+fan' may not meet the requirement. In order to solve this problem, the methods 'heat pipe+radiator fin+fan' and 'water cooling heat dissipation module' are developed. Here takes 'water cooling heat dissipation module' for example.

Refer to FIG. 1A for the side view of a common water cooling heat dissipation module 100. The heat dissipation module 100 is connected to a water pump 200 and a heat source, such as CPU 300. The heat dissipation module 100 includes a copper pipe 120, a plurality of radiator fins 140, a cooling plate 160 and a fan 180. The radiator fin 140 is assembled outside of the copper pipe 120. The fan 180 is disposed by side of the copper pipe 120 and the radiator fin 140, to provide cool air. The cooling plate 160 is fixed on the CPU 300. The water pump 200 pumps the water in the copper pipe 120 of the heat dissipation module 100 to the cooling plate 160 to absorb the heat generated from the CPU 300. The water returns to the heat dissipation module 100 to exchange heat after absorbing energy, referring to the heat exchange path in FIG. 1D, which is described in details in following. After cooled, the water is pumped to the cooling plate 160 to keep the CPU 300 in low temperature.

Refer to FIG. 1B for the A-A section view of the copper pipe 120 and the radiator fin 140 in FIG. 1A. The water 130 flows in the copper pipe 120, while the outer wall of the copper pipe 120 contacts with the annular radiator fin 140. Hence, the heat absorbed by the water 130 may transfer to the surface of the radiator fin 140 through the copper pipe 120 and exchange with the cool air from the fan 180 to reduce the heat in the water 130.

Refer to FIG. 1C for the B-B section view of the copper pipe 120 and the radiator fin 140 in FIG. 1A. The radiator fin 140 curves in L-type, with a connection portion 142 and a fin 144. The connection portion 142 is parallel to the outer wall of the copper pipe 120 and installed on the outer wall of the copper pipe 120 by welding or tight fitting. The fin 144 is vertical to the copper pipe 120 to contact cool air. The disadvantages for this structure is as follows: 1. there is a tiny space 150 between the fin 144 and the copper pipe 120, which causes the contact thermal resistance and bad heat conduction; 2. the copper pipe 120 reacts with the water 130, generating the copper rust; 3. the copper pipe 120 has a high price and a large weight, unfavorable for large yield.

Referring to the FIG. 1D, one part 120a of the copper pipe 120 in FIG. 1A is enlarged for detailed description. The arrow in a pipe-wall 122 of the copper pipe 120 stands for the flow direction of the water 130 and the ⊙ points the flow direction of the cool air toward the outside of the surface of the paper. After absorbing heat, the water 130 flows from one upstream portion 124 of the copper pipe 120 into the pipe-wall 122 and down to one downstream portion 126 of the copper pipe 120. The heat in the water 130 is transferred to the radiator fin 140 through the pipe-wall 122. The fan 180 generates an air flow passing the outer side of the pipe-wall 122, thus the cool air exchanges with the hot radiator fin 140 to cool the water.

However, the heat conduction efficiency of the radiator fin 140 is proportional to the temperature difference of the water in the upstream portion and the downstream portion. The pipe-wall 122 of the copper pipe 120 has a certain thickness and the copper is a good conductor for heat, so when the temperature in the upstream portion 124 of the copper pipe 120 is just to rise, the heat is transferred to the low-temperature downstream portion 126 through the pipe-wall 122 along the flow direction of the water 130 before it is transferred to the first radiator fin 140 outside the pipe-wall 122, as the broken lines shows. Thus the temperature in the upstream portion 124 is lowered, while the temperature in the downstream portion 126 is raised, so the temperature difference of the water in the upstream portion 124 and downstream portion 126 is reduced and the heat conduction efficiency gets worse.

SUMMARY OF THE INVENTION

The object of the present invention is to provide a heat dissipation module for improving the heat conduction efficiency of the radiator fin.

For one or part of or all objectives mentioned or other objectives, one embodiment of the present invention provides a heat dissipation module applied to cooling a microprocessor. The heat dissipation module includes a base, a diversion pipeline, a plurality of heat conductive pieces and a fan. The base is assembled on the microprocessor. The diversion pipeline is connected to the base, provides a diversion direction and has a heat insulated pipe-wall. The diversion pipeline is partitioned off into an inside portion and an outside portion with the heat insulated pipe-wall. The heat insulated pipe-wall reduces the heat conduction in the diversion direction of the diversion pipeline. The plurality of heat conductive pieces are fixed on the diversion pipeline. Each two neighboring heat conductive pieces are separated with the heat insulated pipe-wall of the diversion pipeline. Each of the heat conductive pieces has a heat dissipation direction from the inside portion to the outside portion of the diversion pipeline and across the diversion direction. The fan is assembled on the outside portion of the diversion pipeline, and provides a cool air for the heat conductive pieces.

Another embodiment of the present invention provides a heat dissipation module including a diversion pipeline, a plurality of heat conductive pieces. The diversion pipeline provides a diversion direction and has a heat insulated pipe-wall. The heat insulated pipe-wall reduces the heat conduction in the diversion direction of the diversion pipeline. The plurality of heat conductive pieces are fixed on the heat insulated pipe-wall. Each two neighboring heat conductive pieces are separated with the heat insulated pipe-wall of the diversion pipeline, and each of the heat conductive pieces has a heat dissipation direction substantially vertical to the diversion direction.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The present invention will now be specified with reference to its preferred embodiments illustrated in the drawings, in which FIGS. 1A-1D are the schematic views of the structure of a conventional heat dissipation module;

DESCRIPTION OF THE PREFERRED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention may be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
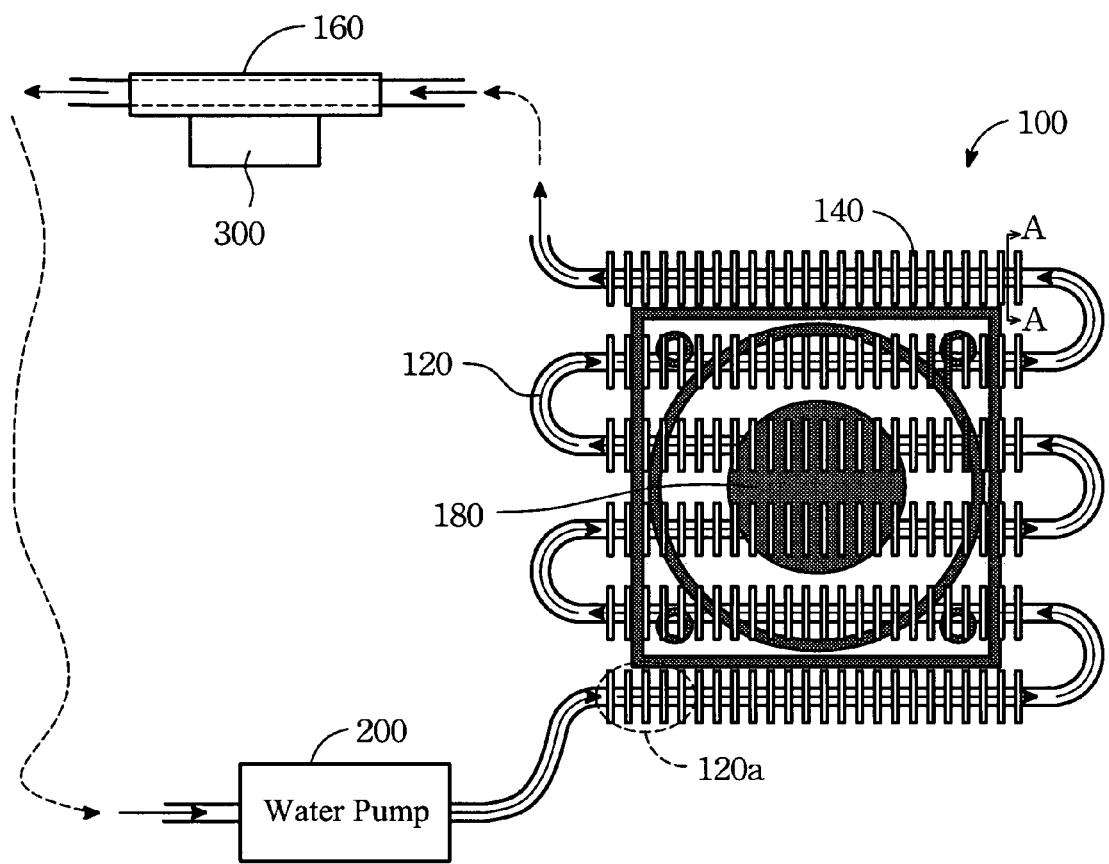
Figure 2A:
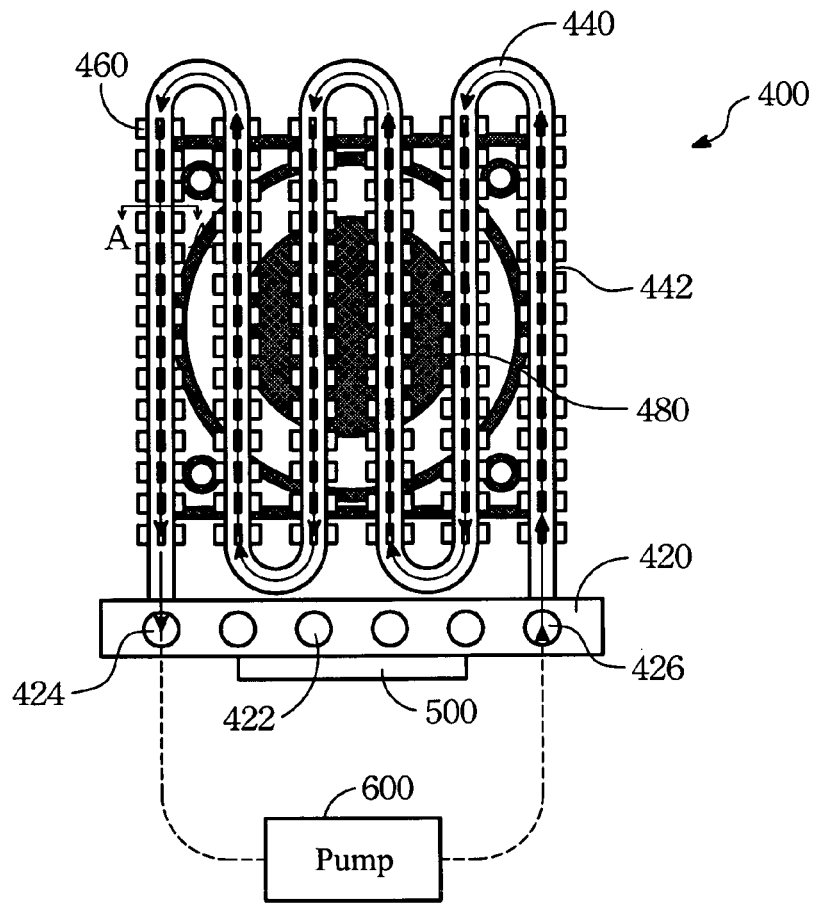
FIG. 2A is the schematic view showing an embodiment of a heat dissipation module according to the present invention.

Refer to FIG. 2A, a heat dissipation module 400 is used to cool a microprocessor 500, such as the CPU. The heat dissipation module 400 includes a base 420, a diversion pipeline 440, a plurality of heat conductive pieces 460 and a fan 480. The base 420 is assembled on the microprocessor 500. The diversion pipeline 440 has an opening(not shown) and a heat insulated pipe-wall 442. The opening is connected to the base 420. The diversion pipeline 440 provides a diversion direction. The diversion pipeline 440 is partitioned off into and inside portion and an outside portion with the heat insulated pipe-wall 442, and the heat insulated pipe-line 442 extends along the diversion direction (shown as arrow) and also reduces the heat conduction in the diversion direction of the diversion pipeline 440. The heat conductive pieces 460 are fixed on the heat insulated pipe-wall 442. Each two neighboring heat conductive pieces 460 are separated with the heat insulated pipe-wall 442. The heat conductive piece 460 has a heat dissipation direction from the inside portion to the outside portion of the diversion pipeline 440, and across or substantially vertical to the diversion direction. The fan 480 is assembled on the outside of the diversion pipeline 440 and the heat conductive pieces 460, and provides a cool air for the heat conductive pieces 460.

There is a flow path 422 disposed inside the base 420. The flow path 422 has a side aperture and two end apertures 424, 426. The flow path 422 is connected to the opening of the diversion pipeline 440 through the side aperture. In a preferable embodiment, the heat dissipation module 400 further includes a pump 600. The inlet and outlet of the pump 600 are connected separately with the two end apertures 424 and 426, to facilitate the flowing of the fluid in the flow path 422 and the diversion pipeline 440, in which the pump 600, the base 420 and the diversion pipeline 440 form an enclosed circle.

Figure 2B:
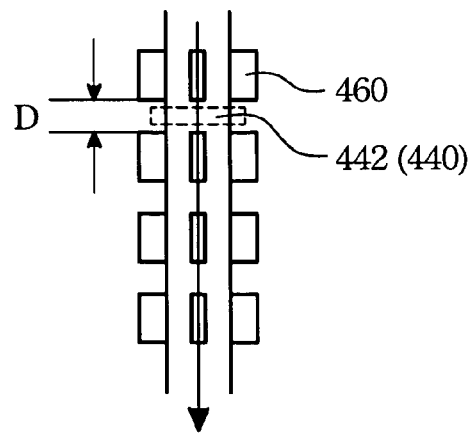
FIG. 2B is the schematic view showing the heat insulated pipe-wall and a heat conductive piece of a diversion pipeline of the heat dissipation module according to one embodiment of the present invention.

Refer to FIG. 2B, the heat insulated pipe-wall 442 of the diversion pipeline 440 is made of the material with the thermal conductivity lower than 20 W/m·K, such as plastic, silicon rubber. The air or water flows in the diversion pipeline 440 along the diversion direction. The heat conductive piece 460 is penetrating the heat insulated pipe-wall 442, arranged along the diversion direction(shown as arrow). There is a space D between each two neighboring heat conductive pieces 460. In this embodiment, the heat conduction in the diversion direction of the diversion pipeline 440 is blocked by the heat insulated pipe-wall 442 within the space D, so there is no or very slow heat conduction between the two neighboring heat conductive pieces 460.

Figure 2C:
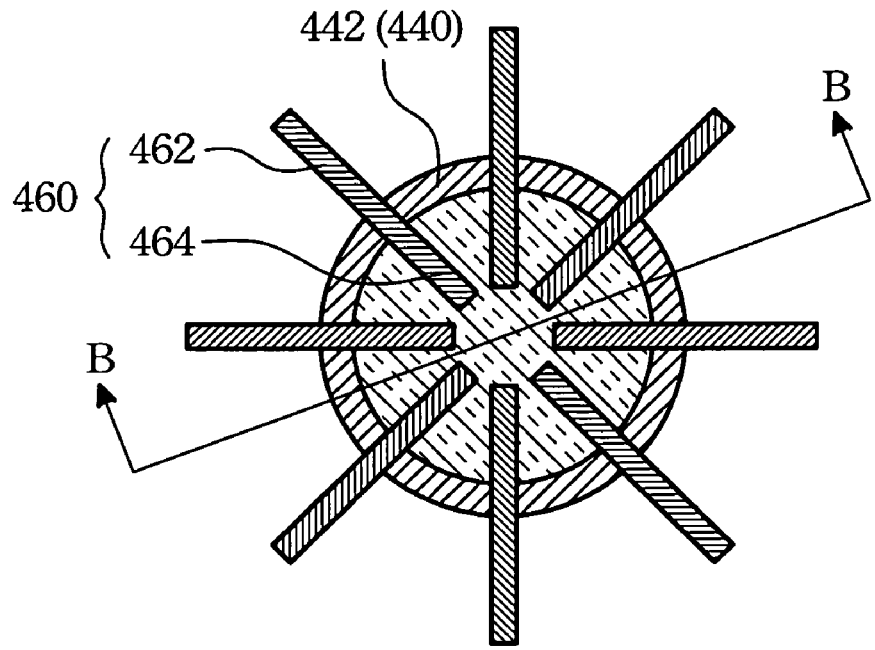
FIG. 2C is the A-A section view of the heat dissipation module in FIG. 2A.

Refer to FIG. 2C for the A-A section view of FIG. 2A. The heat conductive pieces 460 are made of the material with the thermal conductivity higher than 50 W/m·K, such as copper, aluminum, in the way of die-casting, cold forging and extruding, penetrating the heat insulated pipe-wall 442 in radial distribution. Each of the heat conductive pieces 460 in FIG. 2C has an outer fin 462 and an inner fin 464. The inner fin 464 is disposed inside the heat insulated pipe-wall 442 of the diversion pipeline 440, while the outer fin 462 is disposed outside the heat insulated pipe-wall 442 of the diversion pipeline 440. Hence, one end of each of the heat conductive pieces 460 is disposed outside the diversion pipeline 440, while the other end is disposed inside the diversion pipeline 440. The inner fin 464 absorbs the heat from the diversion pipeline 440 and transfers the heat to the outer fin 462. The inner fin 464 in FIG. 2C is substantially vertical to the inner surface of the heat insulated pipe-wall 442, while the outer fin 462 is also substantially vertical to the outer surface of the heat insulated pipe-wall 442. In general, the inner fin 464 and the outer fin 462 in this embodiment are both vertical to the heat insulated pipe-wall 442 approximately.

Figure 2D:
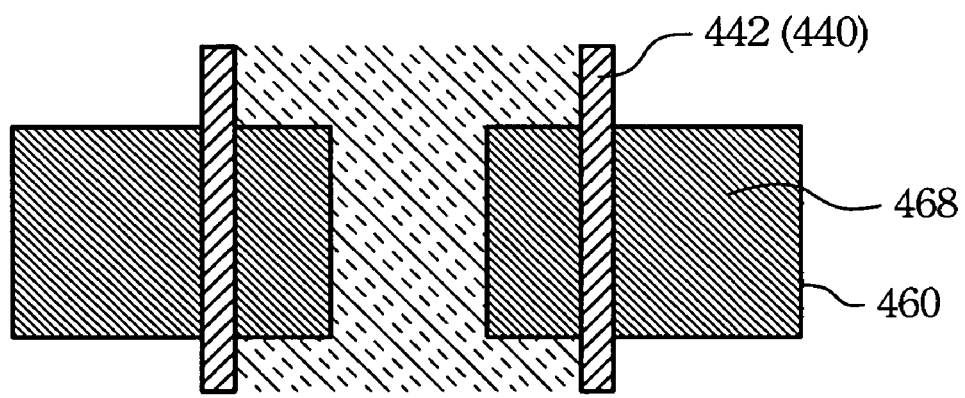
FIG. 2D is the B-B section view of the heat dissipation module in FIG. 2C.

Refer to FIG. 2D for the B-B section view of FIG. 2C. Each of the heat conductive pieces 460 has a heat dissipation surface 468 parallel to the diversion direction of the diversion pipeline 440.

Figure 3:
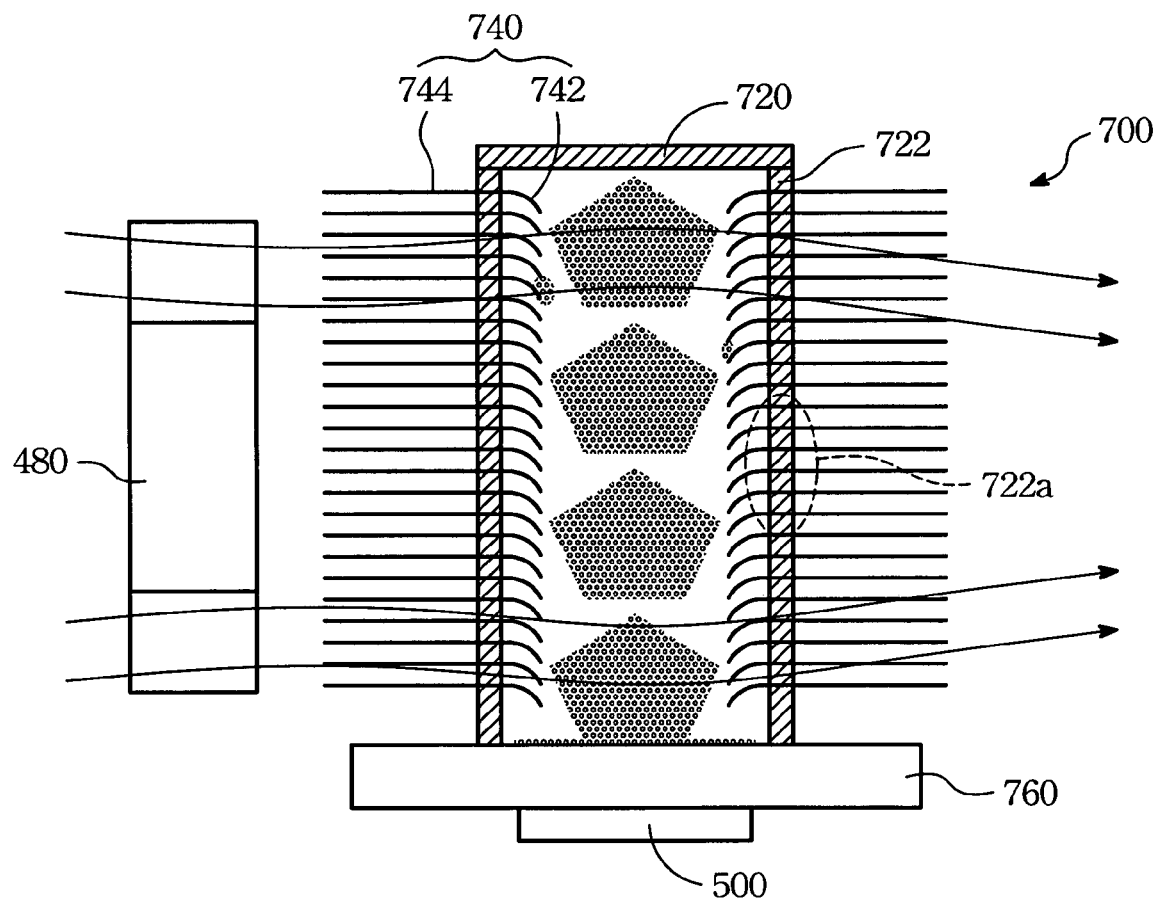
FIG. 3 is the schematic view showing an embodiment of the heat dissipation module according to the present invention.

Refer to FIG. 3 for a heat dissipation module 700 according to another embodiment. It has an upright diversion pipeline 720, such as heat pipe, and a plurality of heat conductive pieces 740. A heat insulated pipe-wall 722 of the diversion pipeline 720 includes a plurality of plastic tube sections(no mark) fitted over each other (referring to FIG. 6C). Each of the plastic tube sections is connected with a heat conductive piece 740. The interfaces between each two adjacent plastic tube sections, or between the plastic tube section and the heat conductive piece 740 are glued. When a heat dissipation base 760 transfers the heat generated by the microprocessor 500 to the liquid water at the bottom of the diversion pipeline 720, the liquid water will be vaporized and formed hydrosphere. The hydrosphere rises and contacts an inner fin 742. The inner fin 742 transfers the heat in the hydrosphere to an outer fin 744. After cooling down, the hydrosphere is condensed to liquid water at the inner fin 742 and returns to the heat dissipation base 760 due to the gravity.

Figure 4A:
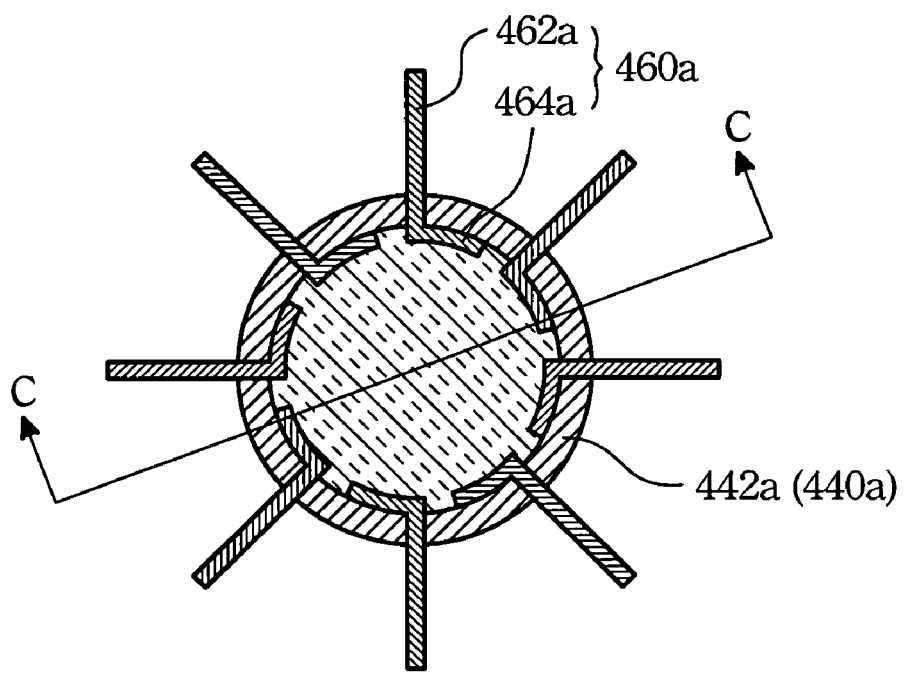
FIGS. 4A-4B is the schematic view showing the heat conductive piece of the heat dissipation module according to one embodiment of the present invention.
Figure 4B:
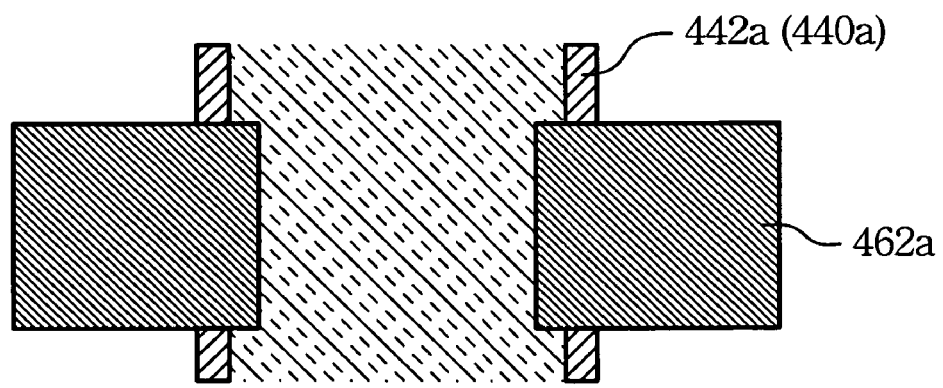

Refer to FIGS. 4A-4B, FIGS. 5A-5B, FIGS. 6A-6C for different types of heat conductive pieces. Compared to the heat conductive piece 460 in FIG. 2C-2D, a heat dissipation surface 468 of the heat conductive piece 460 is extended in the diversion direction. An inner fin 464a of a heat conductive piece 460a in FIG. 4A is formed by bending the inner fin 464 as shown in FIG. 2C, to accord with and paste to the inner surface of a heat insulated pipe-wall 442a of the diversion pipeline 440a, and the inner fin 464a is connected with an outer fin 462a of the heat conductive piece 460a in L-type approximately, so that the flow resistance in the diversion pipeline 440a may be reduced. The heat conductive piece 460a is still penetrating the heat insulated pipe-wall 442a of the diversion pipeline 440a. FIG. 4B is the C-C section view of FIG. 4A, showing the vertical setting of the outer fin 462a and the heat insulated pipe-wall 442a of the diversion pipeline 440a.

Figure 5A:
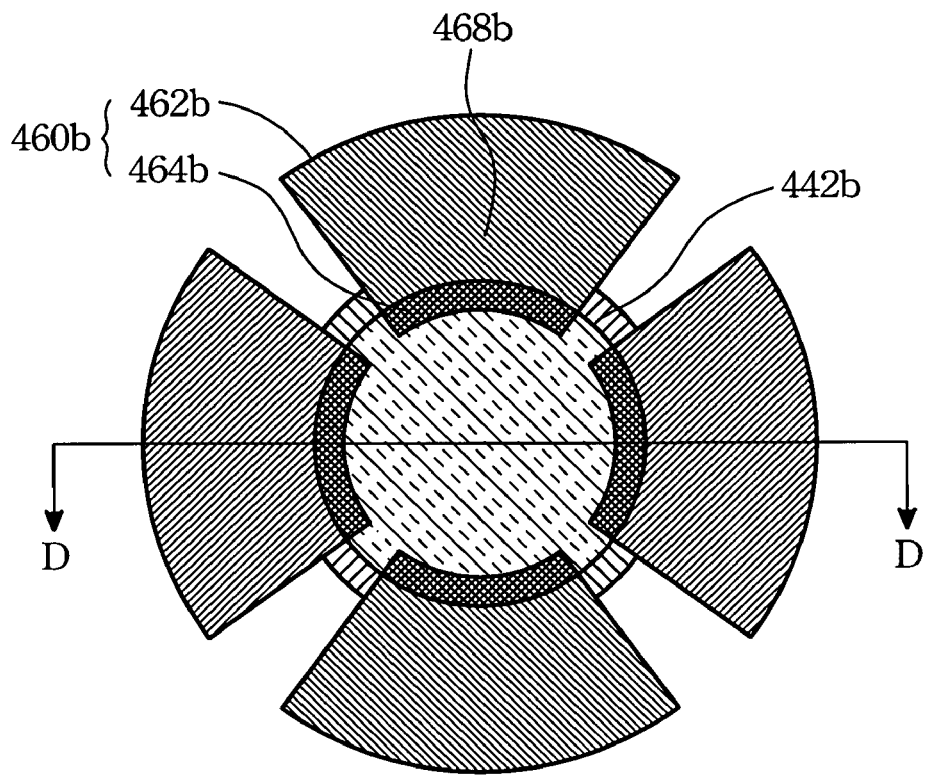
FIGS. 5A-5B is the schematic view showing the heat conductive piece of the heat dissipation module according to one embodiment of the present invention.
Figure 5B:
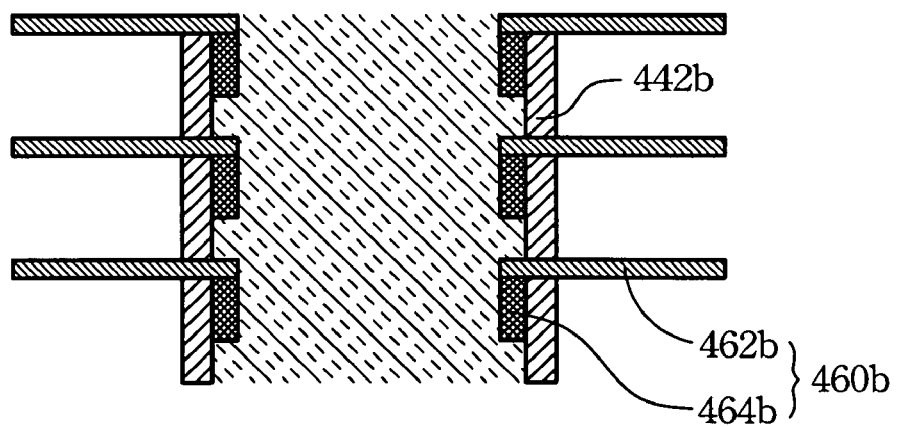

Referring to FIGS. 5A and 5B, an inner fin 464b and an outer fin 462b of the heat conductive piece 460b are connected in L-type. The outer fin 462b has a heat dissipation surface 468b vertical to the diversion direction(in FIG. 5A, the diversion direction is vertical to the surface of the paper). The heat conductive piece 460b is placed by rotating the heat conductive piece 460a in FIG. 4A 90 degree clockwise or anticlockwise relative to the heat insulated pipe-wall 442a of the diversion pipeline 440a, so that the flow resistance in the diversion pipeline 440a and the number of the heat conductive pieces 460b may be reduced. FIG. 5B is the D-D section view of FIG. 5A, showing that the outer fin 462b is vertical to a heat insulated pipe-wall 442b and the bending direction of the inner fin 464b is parallel to the diversion direction.

Figure 6A:
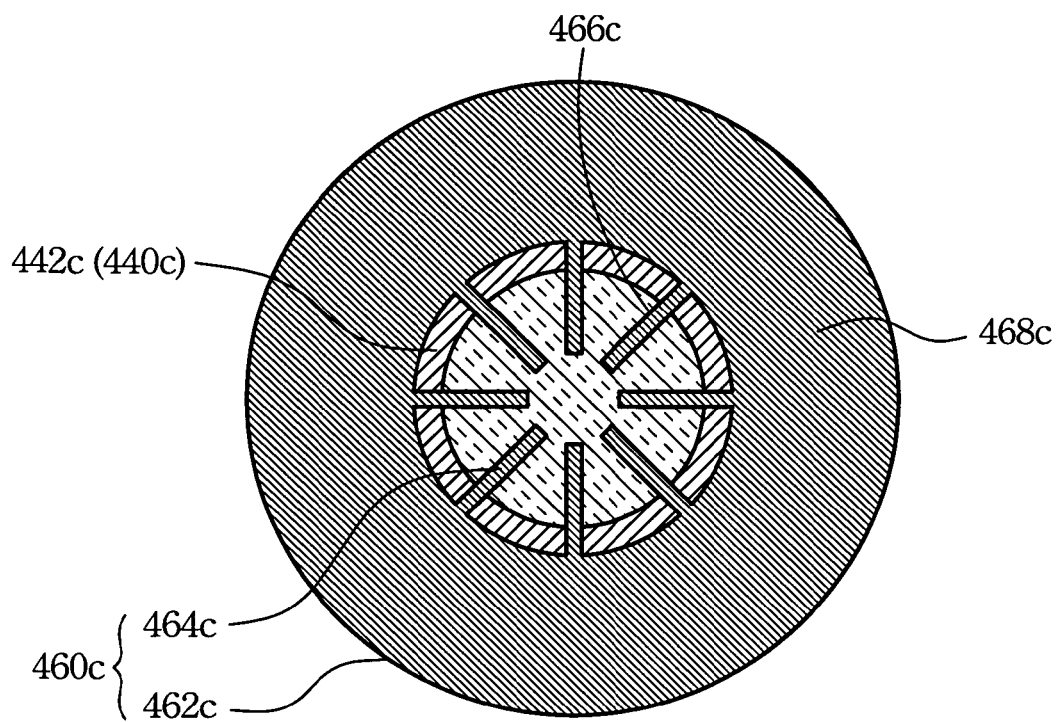
FIGS. 6A-6C is the schematic view showing the heat conductive piece of the heat dissipation module according to one embodiment of the present invention.
Figure 6B:
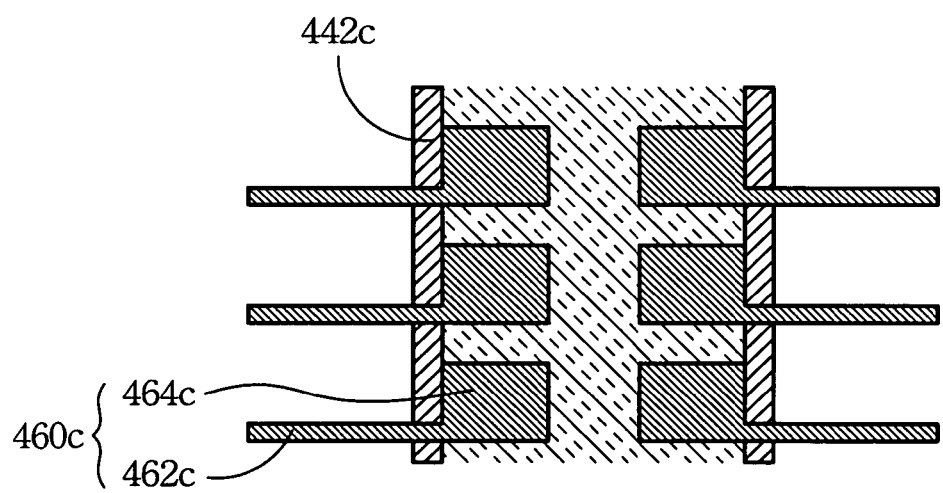
Figure 6C:
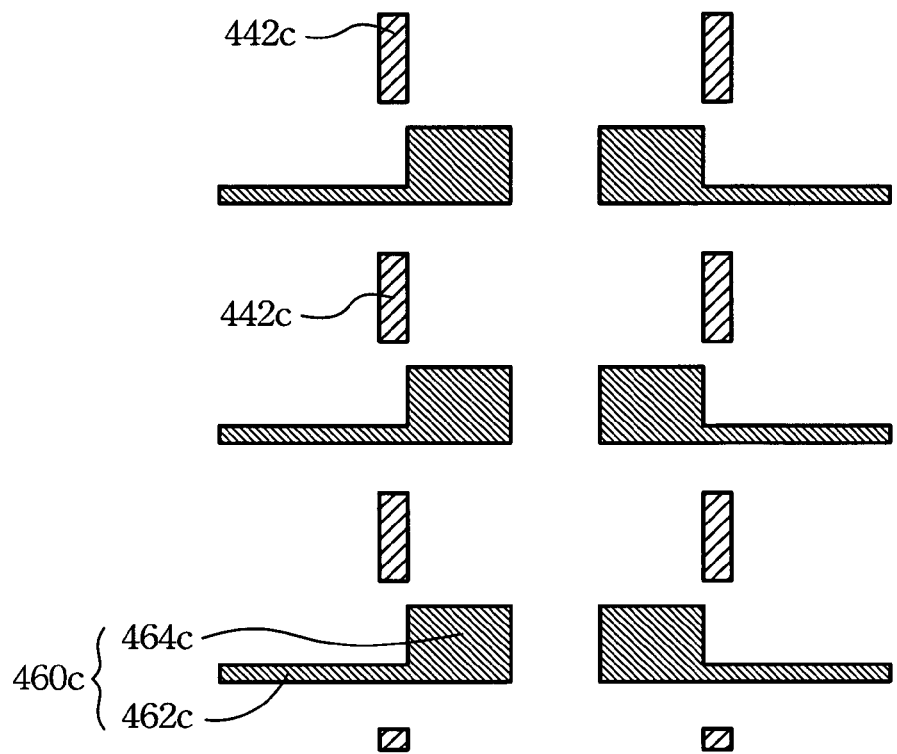

Refer to FIG. 6A-6C, in a preferable embodiment, the heat insulated pipe-wall of a diversion pipeline 440c includes a plurality of rings 442c fitted over each other, and the rings 442c is made of the heat insulated material or low thermal conductivity material. A plurality of heat conductive pieces 460c are disposed on different rings 442c separately. Each of the heat conductive pieces 460c includes a disk outer fin 462c and a plurality of inner fins 464c. The disk outer fin 462c surrounds the corresponding ring 442c, while the inner fins 464c is disposed inside the corresponding ring 442c. Each of the inner fins 464c has a heating surface 466c and each of the disk outer fins 462c has a heat dissipation surface 468c, the heating surface 466c vertical to the heat dissipation surface 468c.

In FIG. 6C, a plurality of the rings 442c and the heat conductive pieces 460c are alternatively connected with each other. Glue is coated on the interface of the ring 442c and its adjacent heat conductive piece 460c to avoid leakage; or pressing the integral to deform the ring 442c to avoid leakage.

In conclusion, no matter what type of heat conductive piece, if only the heat insulated material is obstructed in the heat conductive pieces to delay or stop the heat conduction in the diversion direction of the diversion pipeline, it matches this invention.

Figure 7:
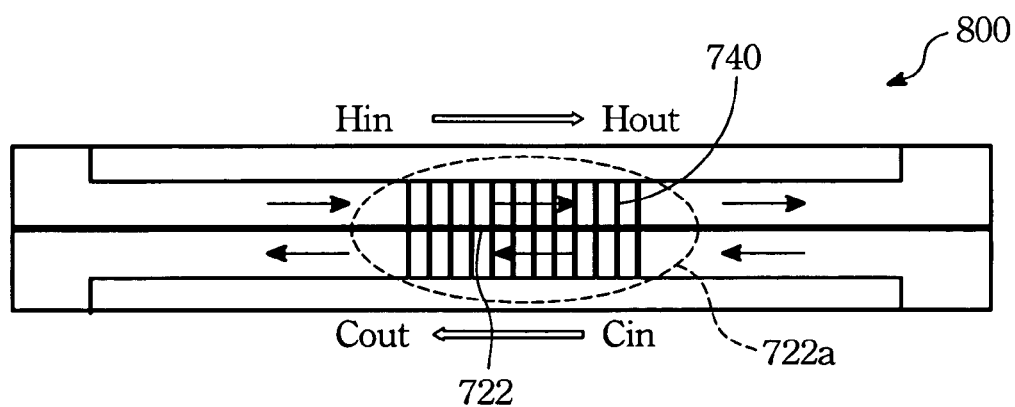
FIG. 7 is the schematic view showing a simulation device of the heat dissipation module according to one embodiment of the present invention.

Refer to FIG. 7 for the heat flow simulation in one part of the diversion pipeline. For example, one part of the diversion pipeline 722a is picked as FIG. 3 shows, which includes a heat insulated pipe-wall 722 and the heat conductive piece 740. In following, the top of the heat insulated pipe-wall 722 is called hot end, the bottom called cool end. In a heat flow simulation device 800, a hot flow is provided flowing from the air inlet Hin of the hot end to the air outlet Hout of the hot end, and a cool flow is provided flowing from the air inlet Cin of the cool end to the air outlet Cout of the cool end.

Given that the temperature of the air inlet Hin of the hot end is 70° C., the air inlet Cin of the cool end is 25° C., and the flux of the cool flow and the hot flow are the same (for example, 1 cfm), when the heat insulated pipe-wall 722 is made of plastic with thermal conductivity 5 W/m·K, the temperature of the air outlet Cout of the cool end is 61° C., but when the material of the heat insulated pipe-wall 722 is changed to aluminum with thermal conductivity 200 W/m·K, the temperature of the air outlet Cout of the cool end is 54° C. Thus, as for the exchange efficiency of the cool end, the heat insulated pipe-wall made of plastic increases 24%[(54−25)/(61−25)] compared to the heat insulated pipe-wall made of aluminum. Therefore, the heat exchange will be favored by blocking the heat diversion in the diversion pipeline 772a.

There are following advantages of the present invention: 1. no metal pipe, cost saving and light weight; 2 no contact thermal resistance; 3. the efficiency of the heat dissipation module better than the conventional structure by blocking, delaying or reducing the heat conduction in the diversion direction of the diversion pipeline; 4. the ratio of the heat diversion efficiency and the volume (P/V) higher than the common structure, so even smaller size reaching the same heat exchange efficiency. In conclusion, the heat dissipation module in the present invention achieves low cost, light weight and small volume with high heat dissipation efficiency.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A heat dissipation module, applied to cooling a microprocessor, comprising:
    a base, assembled on the microprocessor;
    a diversion pipeline, connected to the base, providing a diversion direction and a heat insulated pipe-wall, wherein the diversion pipeline is partitioned off into an inside portion and an outside portion with the heat insulated pipe-wall and wherein the heat insulated pipe-wall reduces the heat conduction in the diversion direction of the diversion pipeline; and
    a plurality of heat conductive pieces, fixed on the diversion pipeline, wherein each two neighboring heat conductive pieces are separated with the heat insulated pipe-wall of the diversion pipeline, and wherein each of the heat conductive pieces has a heat dissipation direction from the inside portion to the outside portion of the diversion pipeline and across the diversion direction; and wherein each of the heat conductive pieces comprises an inner fin inside the diversion pipeline and an outer fin outside the diversion pipeline, and both of the inner fin and the outer fin are substantially vertical to the heat insulated pipe-wall;
    a fan, assembled on the outside portion of the diversion pipeline, providing a cool air for the heat conductive pieces.

2. The heat dissipation module of claim 1, wherein the base has a flow path connected to the diversion pipeline, and the flow path has two end apertures.

3. The heat dissipation module of claim 2, further comprising a pump, wherein an outlet and an inlet of the pump are connected to the two end apertures of the flow path separately.

4. The heat dissipation module of claim 1, wherein one end of the heat conductive piece is outside the diversion pipeline, while the other end of the heat conductive piece is inside the diversion pipeline.

5. The heat dissipation module of claim 1, wherein the heat insulated pipe-wall of the diversion pipeline is made of a material with thermal conductivity lower than 20 W/m·K.

6. The heat dissipation module of claim 1, wherein the heat conductive piece is made of a material with thermal conductivity larger than 50 W/m·K.

7. The heat dissipation module of claim 1, wherein each of the heat conductive pieces comprises an inner fin and an outer fin, wherein the inner fin is inside the diversion pipeline and pasted on the inner surface of the heat insulated pipe-wall, and the outer fin is outside the diversion pipeline, substantially vertical to the heat insulated pipe-wall.

8. The heat dissipation module of claim 1, wherein each of the heat conductive pieces has a heat dissipation surface, parallel to the diversion direction.

9. The heat dissipation module of claim 1, wherein each of the heat conductive pieces has a heat dissipation surface, vertical to the diversion direction.

10. The heat dissipation module of claim 1, wherein each of the heat conductive pieces comprises an inner fin inside the diversion pipeline and an outer fin outside the diversion pipeline, the two fins in L-type bend.

11. The heat dissipation module of claim 1, wherein the heat insulated pipe-wall comprises a plurality of rings fitted over each other.

12. The heat dissipation module of claim 11, wherein the heat conductive pieces are respectively disposed on the different rings, each of the heat conductive pieces comprises a disk outer fin and a plurality of inner fins, and the disk outer fin is disposed surrounding the outside of the corresponding ring, while the inner fins is disposed on the inside of the corresponding ring.

13. The heat dissipation module of claim 12, wherein each of the inner fin of the heat conductive piece has a heating surface, the disk outer fin has a dissipation surface, and the heating surface is vertical to the heat dissipation surface.

14. A heat dissipation module, applied to cooling a microprocessor, comprising:
    a diversion pipeline, providing a diversion direction and a heat insulated pipe-wall, wherein the diversion pipeline is partitioned off into an inside portion and an outside portion with the heat insulated pipe-wall and wherein the heat insulated pipe-wall reduces the heat conduction in the diversion direction of the diversion pipeline; and
    a plurality of heat conductive pieces, fixed on the heat insulated pipe-wall, wherein each two neighboring heat conductive pieces are separated with the heat insulated pipe-wall of the diversion pipeline, and wherein each of the heat conductive pieces has a heat dissipation direction, substantially vertical to the diversion direction and wherein each of the heat conductive pieces comprises an inner fin inside the diversion pipeline and an outer fin outside the diversion pipeline, and both of the inner fin and the outer fin are substantially vertical to the heat insulated pipe-wall.

15. The heat dissipation module of claim 14, wherein the heat insulated pipe-wall of the diversion pipeline is made of a material with thermal conductivity lower than 20 W/m·K.

16. The heat dissipation module of claim 14, wherein the heat conductive piece is made of a material with thermal conductivity larger than 50 W/m·K.

17. The heat dissipation module of claim 14, wherein each of the heat conductive pieces comprises an inner fin and an outer fin, wherein the inner fin is inside the diversion pipeline and pasted on the inner surface of the heat insulated pipe-wall, and the outer fin is outside the diversion pipeline, substantially vertical to the heat insulated pipe-wall.

18. The heat dissipation module of claim 14, wherein each of the heat conductive pieces has a heat dissipation surface, parallel to the diversion direction.

19. The heat dissipation module of claim 14, wherein each of the heat conductive pieces has a heat dissipation surface, vertical to the diversion direction.

20. The heat dissipation module of claim 14, wherein each of the heat conductive pieces comprises an inner fin inside the diversion pipeline and an outer fin outside the diversion pipeline, the two fins in L-type bend.

21. The heat dissipation module of claim 14, wherein the heat insulated pipe-wall comprises a plurality of rings fitted over each other.

22. The heat dissipation module of claim 21, wherein the heat conductive pieces are respectively disposed on the different rings, each of the heat conductive pieces comprises a disk outer fin and a plurality of inner fins, and the disk outer fin is disposed surrounding the outside of the corresponding ring, while the inner fins is disposed on the inside of the corresponding ring.

23. The heat dissipation module of claim 21, wherein each the inner fin of the heat conductive piece has a heating surface, the disk outer fin has a dissipation surface, and the heating surface is vertical to the heat dissipation surface.

* * * * *